United States Patent [19]
Yang et al.

(10) Patent No.: US 10,444,578 B2
(45) Date of Patent: Oct. 15, 2019

(54) MASK STORING METHOD FOR DRIVING MODULE AND RELATED IMAGE DISPLAYING METHOD

(71) Applicant: NOVATEK Microelectronics Corp., Hsin-Chu (TW)

(72) Inventors: Chih-Yuan Yang, Hsinchu County (TW); Shang-Yu Su, New Taipei (TW); Feng-Ting Pai, Hsinchu (TW)

(73) Assignee: NOVATEK Microelectronics Corp., Hsin-Chu (TW)

( * ) Notice: Subject to any disclaimer, the term of this patent is extended or adjusted under 35 U.S.C. 154(b) by 127 days.

(21) Appl. No.: 15/688,882

(22) Filed: Aug. 29, 2017

(65) Prior Publication Data

US 2019/0064575 A1 Feb. 28, 2019

(51) Int. Cl.
*G09G 5/37* (2006.01)
*G02F 1/1345* (2006.01)
*G02F 1/1335* (2006.01)
*G02F 1/1343* (2006.01)
*G03F 1/38* (2012.01)
*G02F 1/1362* (2006.01)
*G09G 3/20* (2006.01)
*G09G 3/36* (2006.01)
*G09G 5/39* (2006.01)

(52) U.S. Cl.
CPC ........ *G02F 1/13454* (2013.01); *G02F 1/1362* (2013.01); *G02F 1/13439* (2013.01); *G02F 1/133509* (2013.01); *G03F 1/38* (2013.01); *G09G 3/20* (2013.01); *G09G 3/36* (2013.01); *G09G 5/39* (2013.01); *G09G 2310/0232* (2013.01); *G09G 2320/0242* (2013.01)

(58) Field of Classification Search
CPC .............. G09G 3/36; G09G 2320/041; G09G 2320/0247; H01L 21/2026; G06T 7/10
USPC ......................................................... 345/563
See application file for complete search history.

(56) References Cited

U.S. PATENT DOCUMENTS

| 8,466,874 B1* | 6/2013 | Gardiner .................. G09G 5/06 315/13.1 |
| 8,824,799 B1* | 9/2014 | Hobbs .................. H04N 1/4092 382/176 |
| 2007/0146386 A1* | 6/2007 | Loce ..................... G06T 11/203 345/611 |
| 2009/0091577 A1* | 4/2009 | Brothers .................... G06T 1/20 345/506 |
| 2013/0238880 A1* | 9/2013 | Toichi ................. G06F 9/30018 712/222 |

* cited by examiner

*Primary Examiner* — Weiming He
(74) *Attorney, Agent, or Firm* — Winston Hsu

(57) ABSTRACT

A mask storing method for a driving module of a display device includes encoding a mask of configuring a non-display area and a display area of a display module of the display device, to generate an encoded mask; and storing the encoded mask to a storage unit of the driving module of the display device.

3 Claims, 6 Drawing Sheets

MASK STORING METHOD FOR DRIVING MODULE AND RELATED IMAGE DISPLAYING METHOD

BACKGROUND OF THE INVENTION

1. Field of the Invention

The present invention relates to a mask storing method for a driving module of a display device and related image displaying method, and more particularly, to a mask storing method of reducing manufacture cost of the driving module and related image displaying method.

2. Description of the Prior Art

The conventional display panel is limited to rectangular shape because requiring a boarder with a minimal width for accommodating routings and driving circuits (e.g. gate driver) around the display panel. In recent years, the routings and driving circuits can be distributed in the display area of the display panel, allowing the display panel to be realized in arbitrary forms (e.g. free form display).

In order to display images on the display panel with various forms, a driver integrated circuit (IC) of the display panel needs to consume significant amount of memory on storing patterns (e.g. masks) of adjusting image data to make image data comply with the form of the display panel. The manufacture cost of the driver IC is increased, therefore. Furthermore, the image displayed by the display panel may exhibit a jagged and colored edge because adjusted based on the patterns, resulting in that the image quality of display panel is downgraded. Thus, how to reduce the cost of storing patterns corresponding to the form of the display panel and to avoid the jagged and colored edge becomes a topic to be discussed.

SUMMARY OF THE INVENTION

In order to solve the above issues, the present disclosure provides a mask storing method of reducing manufacture cost of a driving module of a display device and related image displaying method.

In an aspect, the present invention discloses a mask storing method for a driving module of a display device. The mask storing method comprises encoding a mask of configuring a non-display area and a display area of a display module of the display device, to generate an encoded mask; and storing the encoded mask to a storage unit of the driving module of the display device.

In another aspect, the present invention discloses an image displaying method for a driving module of a display device. The image display method comprises decoding an encoded mask, to generate a first mask of configuring a non-display area and a display area of a display module of the display device; generating a second mask based on the first mask; and overlapping image data and the second mask, to generate driving signals of controlling the display module to display the overlapped image data.

These and other objectives of the present invention will no doubt become obvious to those of ordinary skill in the art after reading the following detailed description of the preferred embodiment that is illustrated in the various figures and drawings.

DETAILED DESCRIPTION

Figure 1:
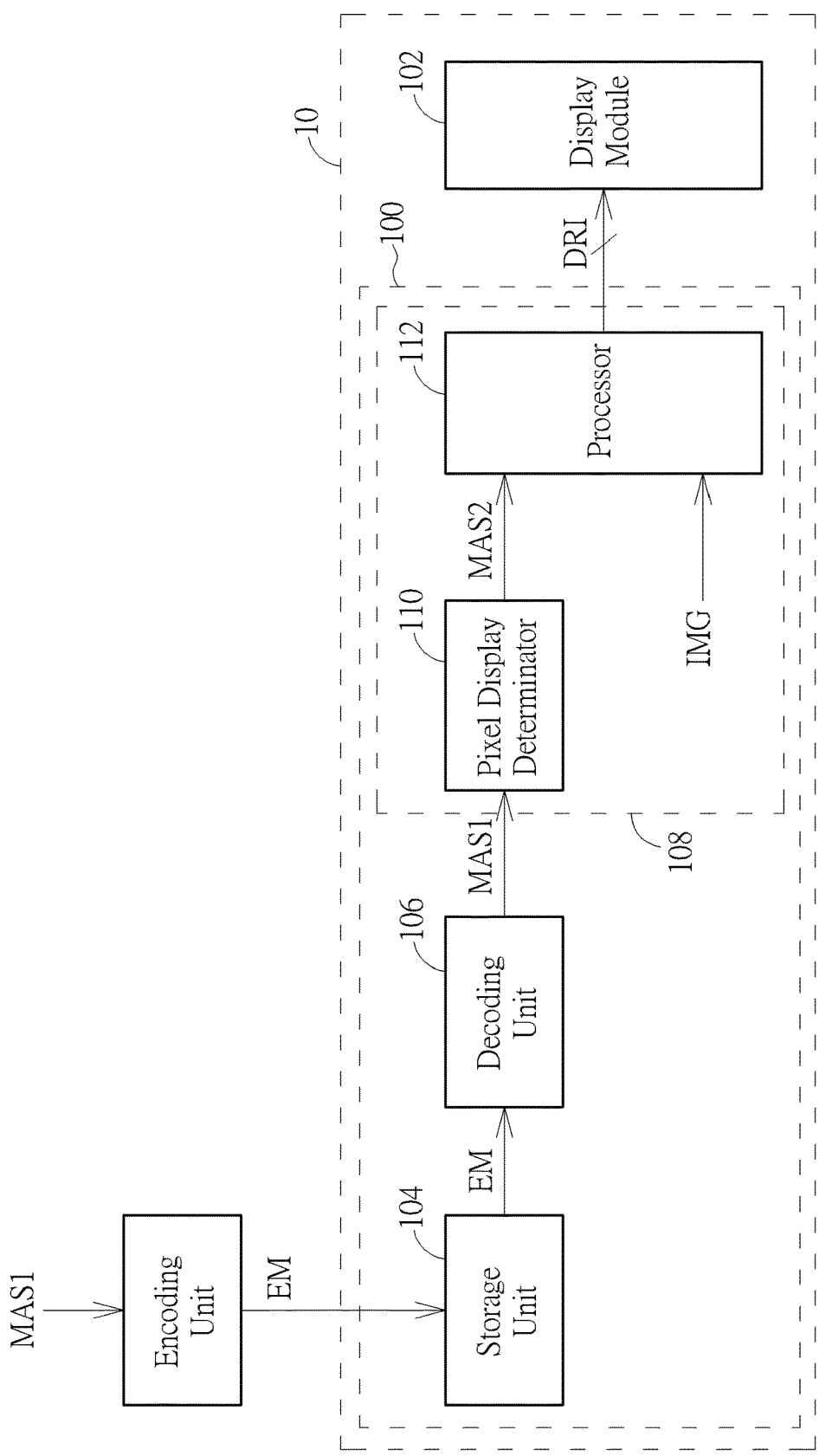
FIG. 1 is a schematic diagram of a display device according to an example of the present invention.

Please refer to FIG. 1, which is a schematic diagram of a display device 10 according to an example of the present invention. The display device 10 may be an electronic product having a panel such as a smart phone, a tablet, a laptop, and a liquid crystal display (LCD) monitor and is not limited herein. As shown in FIG. 1, the display device 10 comprises a driving module 100 (e.g. a driver integrated circuit (IC)) and a display module 102 (e.g. a panel). The driving module 100 generates driving signals DRI based on a mask MAS1 of configuring a non-display area NDA and a display area DA and image data IMG, to control the display module 102 to display images data IMG corresponding to the display area DA. In this example, the mask MAS1 is encoded to be an encoded mask EM and stored in the driving module 100. Because of the encoding process, the size of encoded mask EM is significantly smaller than that of the mask MAS1. Under such a condition, the driving module 100 does not need to consume large amount of memory on storing the mask MAS1. The manufacture cost of the driving module 100 is reduced, therefore.

In detail, the mask MAS1 is encoded by an encoding unit before stored in a storage unit 104 (e.g. random access memory (RAM) or flash memory) of the driving module 100. In this example, the encoding unit is an external component. According to different applications and design concepts, the encoding unit may be realized in various methods and the method of the encoding the mask MAS1 may be appropriately altered. Please refer to FIG. 2, which is a schematic diagram of the mask MAS1 according to an example of the present invention. The mask MAS1 shown in FIG. 2 comprises an 8*8 array consisted of display units $D_{11}$-$D_{88}$. The mask MAS1 shown in FIG. 2 has the non-display area NDA comprising the display units $D_{11}$-$D_{17}$, $D_{21}$-$D_{24}$, $D_{31}$, $D_{32}$, $D_{41}$, $D_{42}$, $D_{51}$, $D_{61}$, and $D_{71}$, and the display area DA comprising the display units $D_{18}$, $D_{25}$-$D_{28}$, $D_{33}$-$D_{38}$, $D_{43}$-$D_{48}$, $D_{52}$-$D_{58}$, $D_{62}$-$D_{68}$, $D_{72}$-$D_{78}$ and $D_{81}$-$D_{88}$. In this example, the edge between the display area DA and the non-display area NDA exhibits a curve shape corresponding to parts (e.g. a left-top edge) of the display module 102.

Figure 2:
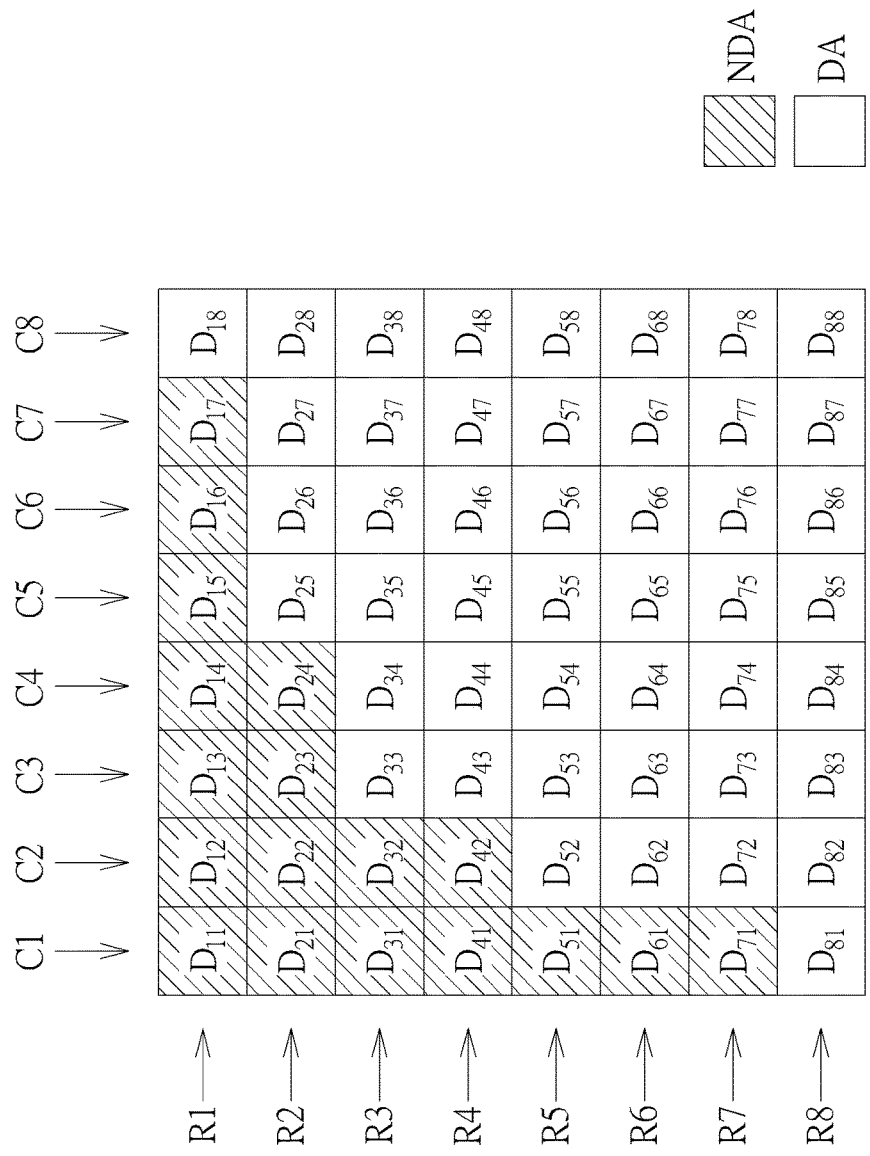
FIG. 2 is a schematic diagram of the mask according to an example of the present invention.

Note that, the mask MAS1 could be altered according to different applications and design concepts and is not limited to the example shown in FIG. 2. In an example, the mask MAS1 may comprise an m*n array of display units, wherein m and n are positive integers. In addition, the shape of the edge between the display area DA and the non-display area NDA may be appropriately changed. Further, each of the display units $D_{11}$-$D_{88}$ may be corresponding to 1 pixel of the display module 102 or 1 sub-pixel (e.g. a green sub-pixel, a red sub-pixel or a blue sub-pixel) of the display module 102.

In an example, the encoding unit counts the number of display units in the non-display area NDA in each row as encoded data of the encoded mask EM. In the example shown in FIG. 2, the non-display area NDA includes 7 display units ($D_{11}$-$D_{17}$) in the row R1 and the encoded data of the row R1 is "7"; the non-display area NDA includes 4 display units ($D_{21}$-$D_{24}$) in the row R2 and the encoded data of the row is "4"; and so on. Based on the above principles, the encoded data of the rows R1-R8 would be "7", "4", "2", "2", "1", "1", "1", and "0". Conventionally, the mask MAS1 may be recorded by 8*8 bits. In comparison, the encoded mask EM can be recorded by only 3*8 bits by using the encoding process. The size of the encoded mask EM is significantly smaller than that of the mask MAS1.

Note that, the method of encoding the mask MAS1 may be appropriately altered and is not limited herein. For example, the encoding unit may count the amount of display units in the display area DA in each row as the encoded data of each row. Or, the encoding unit may count the amount of display units in the non-display area NDA in each column as the encoded data of each column.

After encoding the mask MAS1 to generate the encoded mask EM, the encoding unit stores the encoded mask EM to the storage unit 104 of the driving module 100. The driving module 100 comprises a decoding unit 106 utilized to decode the encoded mask EM and to rebuilt and transmit the mask MAS1 to a pixel display determinator 110 of a processing unit 108. Next, the pixel display determinator 110 generates a mask MAS2 based on the mask MAS1 to allow the processor 112 to overlap the mask MAS2 and the image data IMG and to generate corresponded driving signals DRI. As a result, the image data IMG can be adjusted based on the mask MAS2 to comply with the form of the display module 102.

According to different applications and design concepts, the pixel display determinator 110 may use different methods to generate the mask MAS2 based on the mask MAS1. In an example, the pixel display determinator 110 determines that the mask MAS1 fits the form of the area of the display module 102 corresponding to the image data IMG and directly uses the mask MAS1 as the mask MAS2. Under such a condition, the image data IMG corresponding to the display units $D_{11}$-$D_{17}$, $D_{21}$-$D_{24}$, $D_{31}$, $D_{32}$, $D_{41}$, $D_{42}$, $D_{51}$, $D_{61}$, and $D_{71}$ in the non-display area NDA is masked and the driving signals DRI are generated based on the image data IMG corresponding to the display units $D_{18}$, $D_{25}$-$D_{28}$, $D_{33}$-$D_{38}$, $D_{43}$-$D_{48}$, $D_{52}$-$D_{58}$, $D_{62}$-$D_{68}$, and $D_{72}$-$D_{78}$ in the display area DA.

In an example, the pixel display determinator 110 determines that the upside-down mask MAS1 fits the form of the area of the display module 102 corresponding to the image data IMG. In this example, the pixel display determinator 110 accesses the mask MAS1 from bottom side, to reverse the mask MAS1 upside-down and to generate the mask MAS2.

Figure 3:
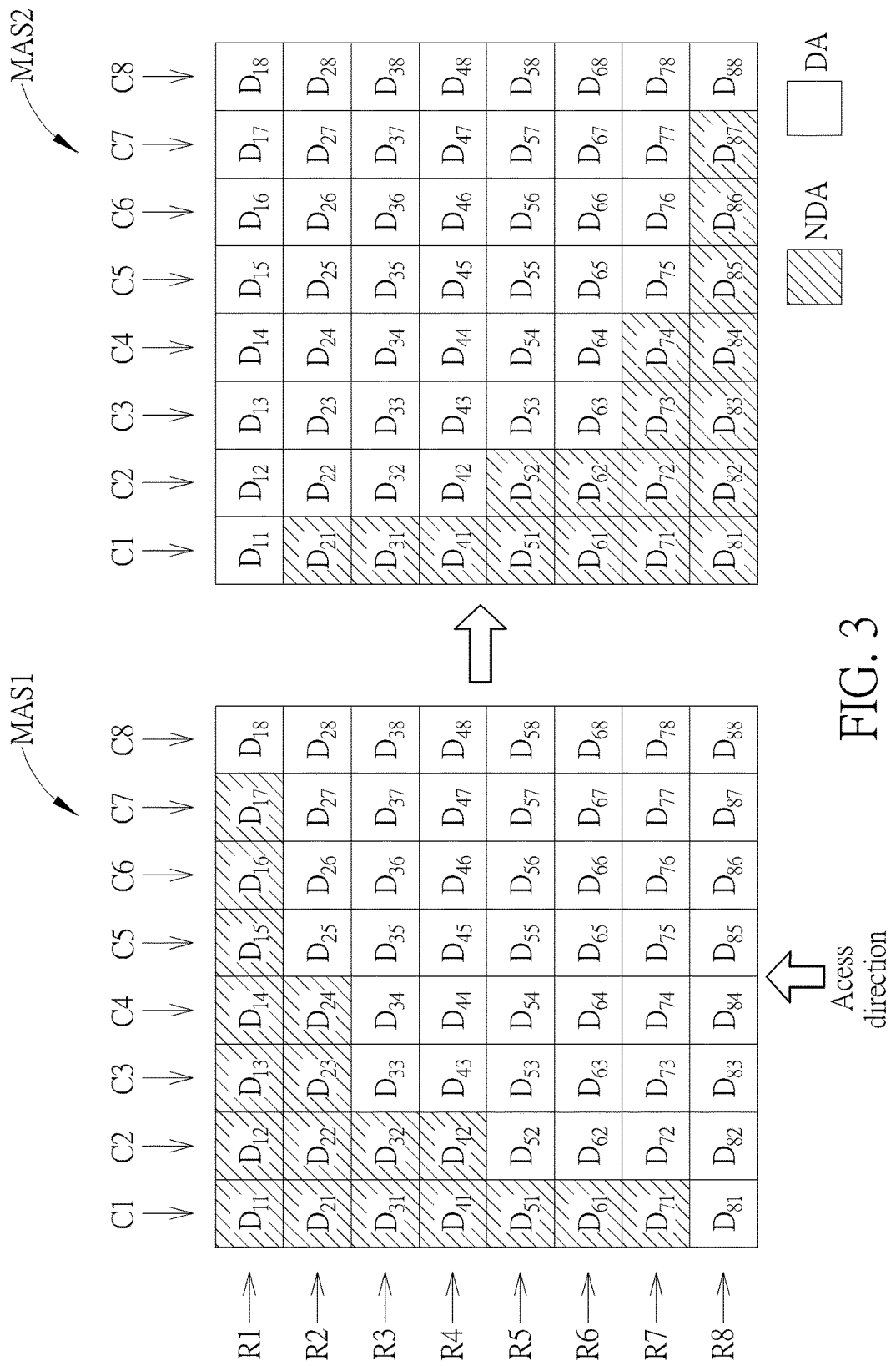
FIG. 3 is a schematic diagram of the masks according to an example of the present invention.

As to details of the pixel display determinator 110 accessing the mask MAS1 from the bottom side, please refer to FIG. 3, which is a schematic diagram of the masks MAS1 and MAS2 according to an example of the present invention. In the example shown in FIG. 3, the pixel display determinator 110 accesses the row R8 of the mask MAS1 as the row R1 of the mask MAS2, accesses the row R7 of the mask MAS1 as the row R2 of the mask MAS2, and so on. As a result, the pixel display determinator 110 is able to generate the mask MAS2 equal to the upside-down mask MAS1. Under such a condition, the processor 112 masks the image data IMG corresponding to the display units $D_{21}$, $D_{31}$, $D_{41}$, $D_{51}$, $D_{52}$, $D_{61}$, $D_{62}$, $D_{71}$-$D_{74}$, and $D_{81}$-$D_{87}$ in the non-display area NDA of mask MAS2 shown in FIG. 3 and generates the driving signals DRI based on the image data IMG corresponding to the display units $D_{11}$-$D_{18}$, $D_{22}$-$D_{28}$, $D_{32}$-$D_{38}$, $D_{42}$-$D_{48}$, $D_{53}$-$D_{58}$, $D_{63}$-$D_{68}$, $D_{75}$-$D_{78}$, and $D_{88}$ in the display area DA of the mask MAS2 shown in FIG. 3.

In another example, the pixel display determinator 110 determines that the laterally reversed mask MAS1 fits the form of the region corresponding to the image data IMG on the display module 102. In this example, the pixel display determinator 110 accesses the mask MAS1 from right side, to generate the mask MAS2.

Figure 4:
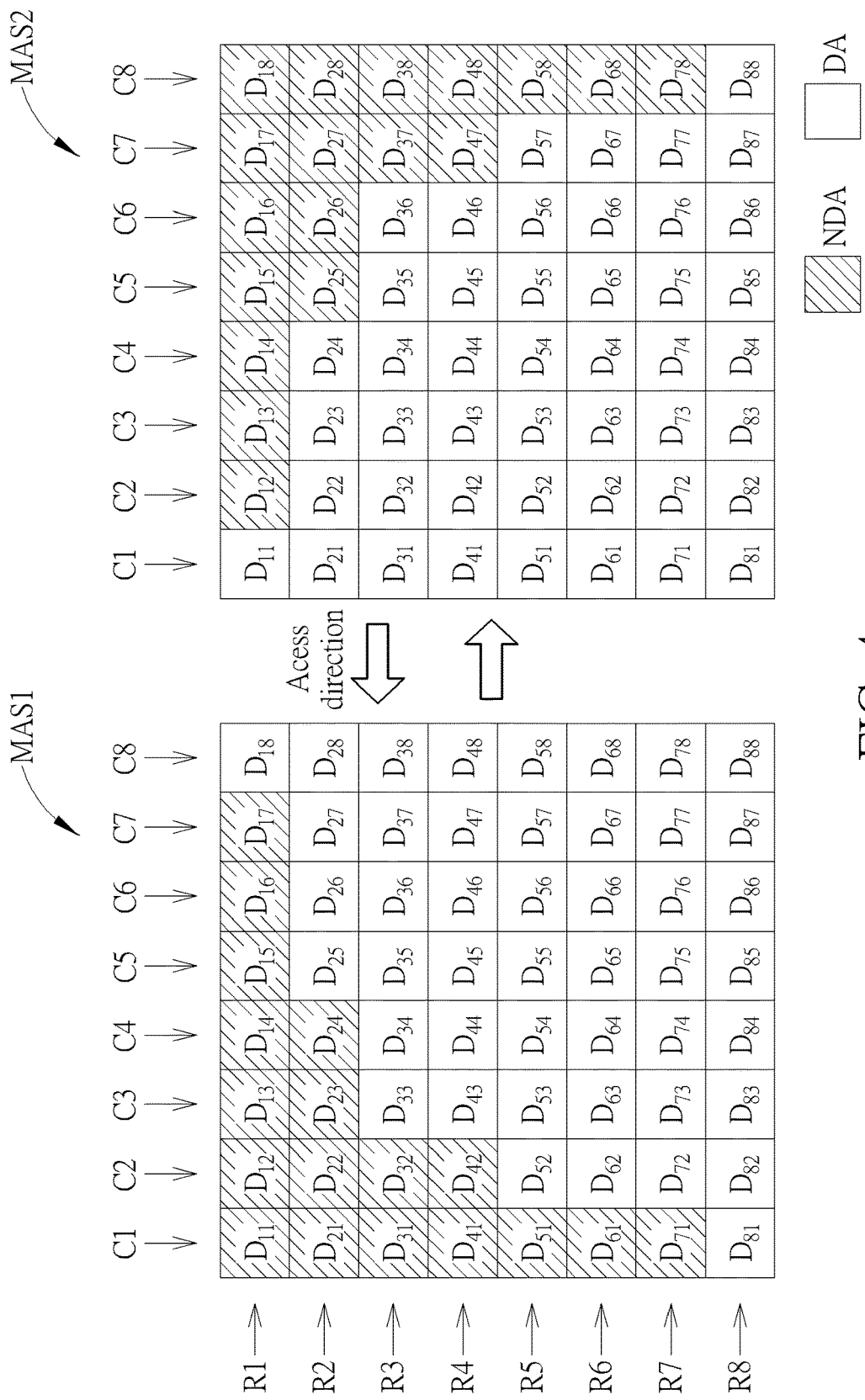
FIG. 4 is a schematic diagram of the masks according to an example of the present invention.

As to details of the pixel display determinator 110 accessing the mask MAS1 from the right side, please refer to FIG. 4, which is a schematic diagram of the masks MAS1 and MAS2 according to an example of the present invention. In the example shown in FIG. 4, the pixel display determinator 110 accesses the column C8 of the mask MAS1 as the column C1 of the mask MAS2, accesses the column C7 of the mask MAS1 as the column C2 of the mask MAS2, and so on. As a result, the pixel display determinator 110 is able to generate the mask MAS2 equal to the laterally reversed mask MAS1. The processor 112 masks the image data IMG corresponding to the display units $D_{12}$-$D_{18}$, $D_{28}$-$D_{28}$, $D_{37}$, $D_{38}$, $D_{47}$, $D_{48}$, $D_{58}$, $D_{68}$, and $D_{78}$ in the non-display area NDA of mask MAS2 shown in FIG. 4 and generates the driving signals DRI based on the image data IMG corresponding to the display units $D_{11}$, $D_{21}$-$D_{24}$, $D_{31}$-$D_{36}$, $D_{41}$-$D_{46}$, $D_{81}$-$D_{87}$, $D_{61}$-$D_{67}$, $D_{71}$-$D_{77}$, and $D_{18}$-$D_{88}$ in the display area DA of the mask MAS2 shown in FIG. 4.

In still another example, the pixel display determinator 110 determines that the upside-down and laterally reversed mask MAS1 fits the form of the region corresponding to the image data IMG on the display module 102. In this example, the pixel display determinator 110 accesses the mask MAS1 from right-bottom side, to generate the mask MAS2.

Figure 5:
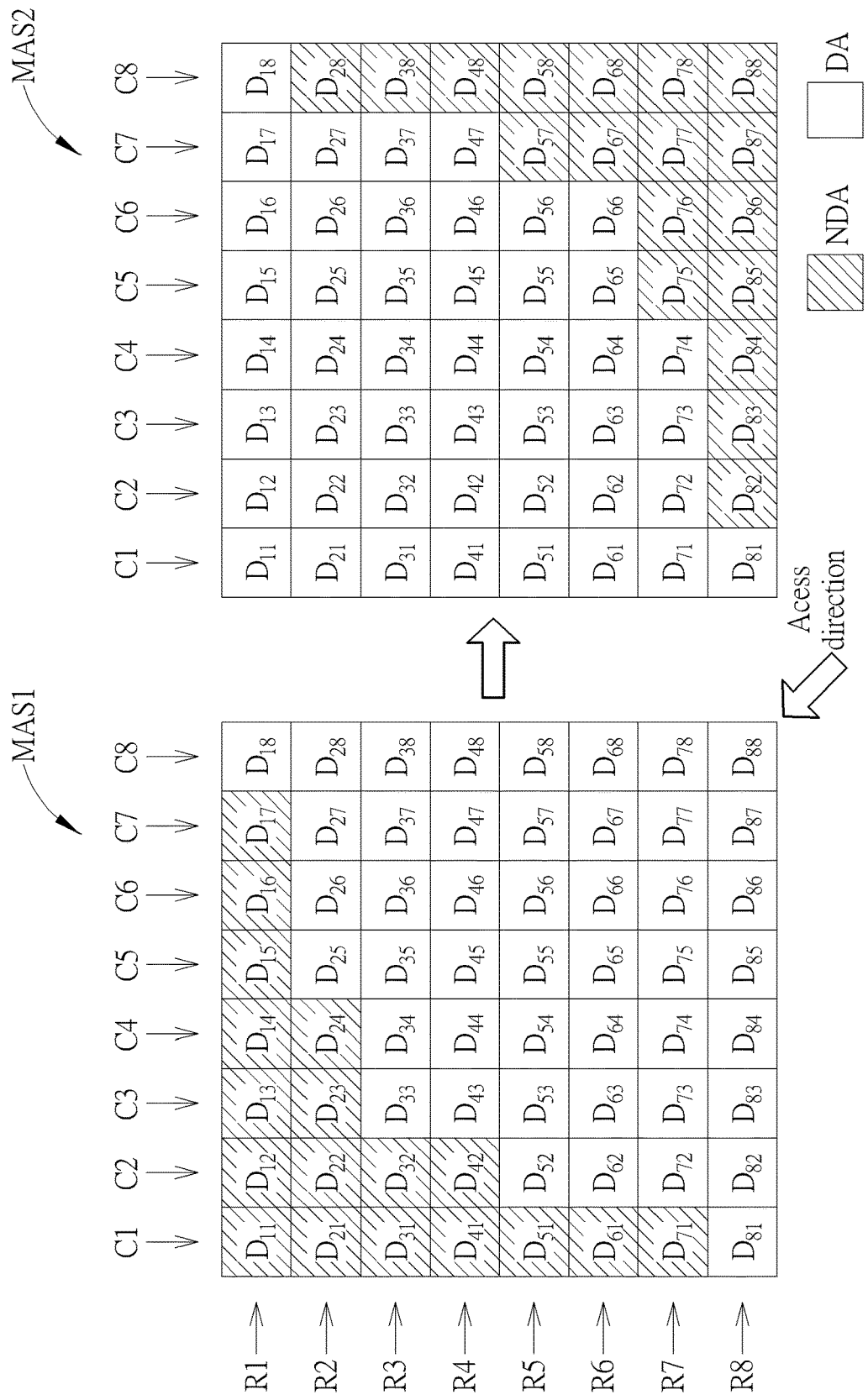
FIG. 5 is a schematic diagram of the masks according to an example of the present invention.

As to details of the pixel display determinator 110 accessing the mask MAS1 from the right-bottom side, please refer to FIG. 5, which is a schematic diagram of the masks MAS1 and MAS2 according to an example of the present invention. In the example shown in FIG. 5, the pixel display determinator 110 accesses the column C8 of the mask MAS1 form bottom to top as the column C1 of the mask MAS2 from top to bottom, accesses the column C7 of the mask MAS1 form bottom to top as the column C2 of the mask MAS2 from top to bottom, and so on. As a result, the pixel display determinator 110 is able to generate the mask MAS2 equal to the upside down and laterally reversed mask MAS1. Under such a condition, the processor 112 masks the image data IMG corresponding to the display units $D_{28}$, $D_{38}$, $D_{48}$, $D_{57}$, $D_{58}$, $D_{67}$, $D_{68}$, $D_{75}$-$D_{78}$ and $D_{82}$-$D_{88}$ in the non-display area NDA of mask MAS2 shown in FIG. 5 and generates the driving signals DRI based on the image data IMG corresponding to the display units $D_{11}$-$D_{18}$, $D_{21}$-$D_{27}$, $D_{31}$-$D_{37}$, $D_{41}$-$D_{47}$, $D_{51}$-$D_{55}$, $D_{61}$-$D_{66}$, $D_{71}$-$D_{74}$, and $D_{81}$ in the display area DA of the mask MAS2 shown in FIG. 5.

As can be seen from FIGS. 3-5, the pixel display determinator 110 is able to generate 4 kinds of mask MAS2 according to the mask MAS1 by accessing the mask MAS1 from different directions. The memory consumes on storing patterns corresponding to the form of the display module 102 is further decreased, therefore.

According to different applications and design concepts, the pixel display determinator 110 may adopt different methods to generate the masks MAS2 shown in FIGS. 3-5 based on the mask MAS1. For example, the pixel display determinator 110 may firstly access the mask MAS1 from the bottom side to generate a mask MAS3 and then access the mask MAS3 from the right side to generate the mask MAS2 shown in FIG. 5. Or, the pixel display determinator 110 may firstly access the mask MAS1 from the right side to generate a mask MAS4 and then access the mask MAS4 from the bottom side to generate the mask MAS2 shown in FIG. 5.

When the display units in the mask MAS2 are corresponding to sub-pixels of the display module 102, the images displayed by the display module 102 may exhibit jagged and colored edge because the image data IMG is adjusted by the mask MAS2. In order to avoid the jagged and colored edge, the processor 112 may further adjust the image data IMG after overlapping the image data IMG and the mask MAS2.

Figure 6:
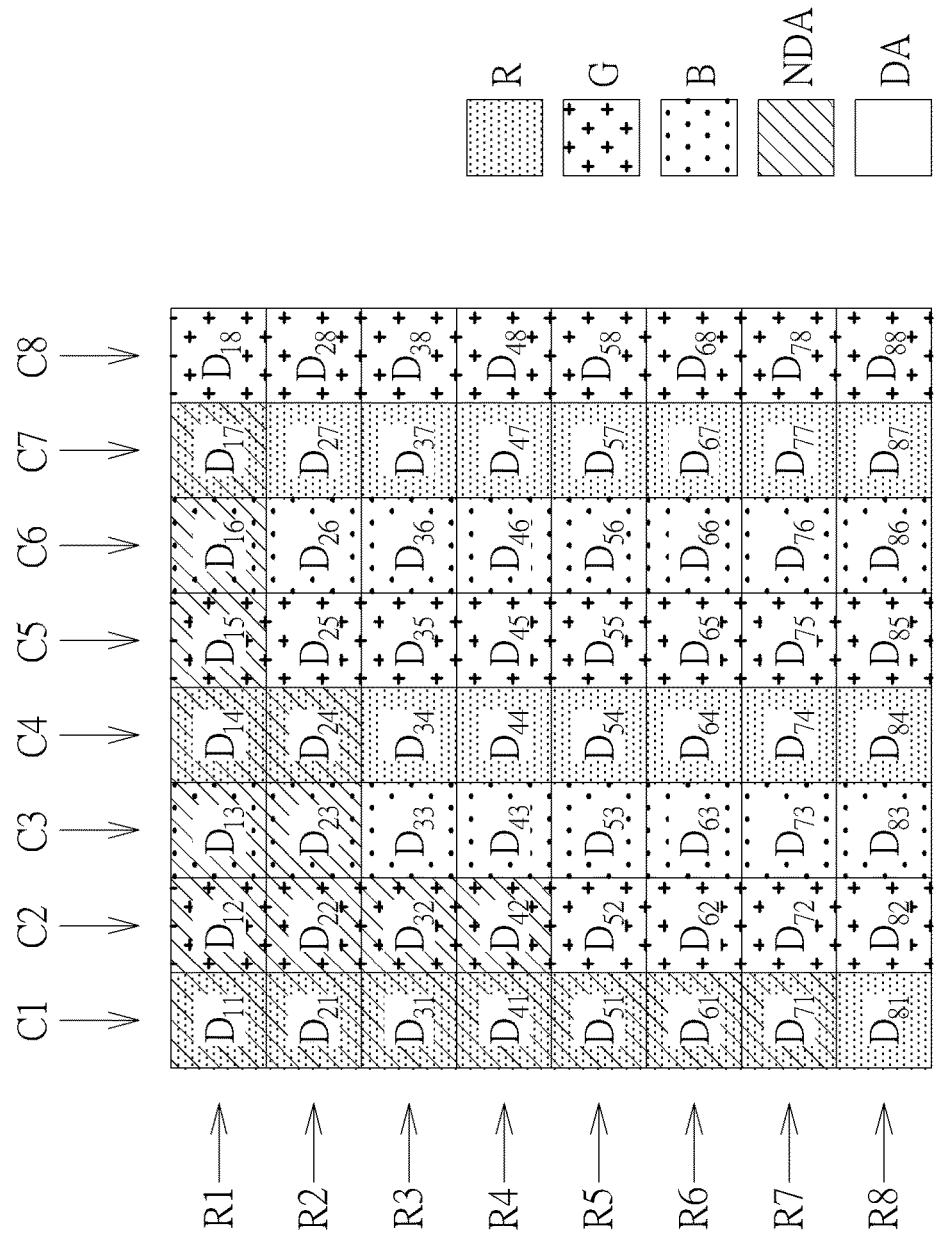
FIG. 6 is a schematic diagram of the overlapped image data according to an example of the present invention.

Please refer to FIG. 6, which is a schematic diagram of the image data IMG overlapped by the mask MAS2 equal to the mask MAS1. As shown in FIG. 6, each of display units $D_{11}$-$D_{88}$ is corresponding to a sub-pixel of the display module 102, wherein the display units $D_{11}$-$D_{81}$, $D_{14}$-$D_{84}$ and $D_{17}$-$D_{87}$ are red sub-pixels, the display units $D_{12}$-$D_{82}$, $D_{15}$-$D_{85}$ and $D_{18}$-$D_{88}$ are green sub-pixels, and the display units $D_{13}$-$D_{83}$ and $D_{15}$-$D_{85}$ are blue sub-pixels. In this example, the display units $D_{11}$-$D_{13}$ are corresponding to 1 pixel of the display module 102, the display units $D_{14}$-$D_{15}$ are corresponding to another 1 pixel of the display module 102, the display units $D_{17}$, $D_{18}$ and the display unit (i.e. a blue sub-pixel) horizontally next to the display unit D18 are corresponding to other pixel of the display module 102, and so on.

As can be seen from FIG. 6, the display units corresponding to the same pixel may be partly masked (i.e. partly in the non-display area NDA) when the image data is overlapped by the mask MAS2. For example, the display unit $D_{17}$ is masked (i.e. in the non-display are NDA) and the display unit $D_{18}$ and the display unit next to the display unit $D_{18}$ belonging to the same pixel of the display unit $D_{17}$ are not masked (i.e. in the display area DA). Under such a condition, the edge between the non-display area NDA and the display area DA may be colored and jagged. To eliminate the colored and jagged edge and improve the image quality of the display module 102, the processor 112 adjusts the image information (e.g. luminance) of the display units that are at the edge between the non-display area NDA and the display area DA and in the pixels with masked display units (e.g. the display units $D_{18}$, $D_{25}$, $D_{26}$, $D_{33}$, $D_{43}$, $D_{52}$, $D_{53}$, $D_{62}$, $D_{63}$, $D_{72}$ and $D_{73}$ shown in FIG. 6).

In an example, if the display units are at the edge between the non-display area NDA and the display area DA and in the pixels with masked display units, the processor 112 adjusts the image information of these display units to be 0. For example, the processor 112 adjusts the image information of the display units D25 and D26 shown in FIG. 6 to 0 because the pixel of the display units $D_{25}$ and $D_{25}$ has the masked display unit $D_{24}$. Similarly, the image information of the display units $D_{33}$, $D_{43}$, $D_{52}$, $D_{53}$, $D_{62}$, $D_{63}$, $D_{72}$ and $D_{73}$ are adjusted to 0. The luminance of the display units located at the edge of non-display area NDA and the display area DA are removed, so as to eliminate the colored and jagged edge on the display module 102.

In another example, if the display units are at the edge of the non-display area NDA and the display area DA and in the pixels with masked display units, the processor 112 adjusts the image information of these display units based on the image information of the display units that are in the display area DA, have the same color and laterally next to these display units. For example, the processor 112 adjusts the luminance of the display unit $D_{33}$ shown in FIG. 6 based on the luminance of the display unit $D_{36}$ that is in the display area DA, has the same color with the display unit $D_{36}$ and laterally next to the display unit $D_{33}$. According an example of the present invention, the processor adjusts both the luminance of the display units $D_{33}$ and $D_{36}$ to be half of luminance of the display unit $D_{36}$. The luminance of the display units close to the edge of non-display area NDA and the display area DA are reduced, so as to mitigate the colored and jagged edge on the display module 102.

In still another example, the processor 112 uses an average filter on the display units at the edge between the non-display area NDA and the display area DA, wherein the average filter adjusts the image information of a plurality of unmasked display units (i.e. the display units in the display area DA) at the edge between the non-display area NDA and the display area DA to be an average of the image information of the plurality of unmasked display units. In the example shown in FIG. 6, the average filter acquires an average the luminance of the display units $D_{18}$ and 4 display units next to the display units $D_{18}$ (not shown in FIG. 6) and adjusts the luminance of the display units $D_{18}$ and the 4 display units next to the display units $D_{18}$ to be the average; acquires another average of the luminance of the display units $D_{25}$-$D_{28}$ and 1 display unit next to the display units $D_{28}$ (not shown in FIG. 6) and adjusts the luminance of the display units $D_{25}$-$D_{28}$ and the display unit next to the display units $D_{28}$ to be the average; and so on. The luminance of the display units close to the edge of non-display area NDA and the display area DA are reduced, so as to avoid the colored and jagged edge on the display module 102.

In the above examples, the present invention encodes the mask and stores the encoded mask to the driving module, to reduce the memory of storing the masks in the driving module. The manufacture cost of driving module is decreased, therefore. Furthermore, since single mask can be accessed from different directions to generate multiple masks, the memory of storing the masks is further reduced. In addition, the image information at the edge between the non-display area and the display area are adjusted after the image data is overlapped by the mask, so as to avoid colored and jagged edge on the display module.

Those skilled in the art will readily observe that numerous modifications and alterations of the device and method may be made while retaining the teachings of the invention. Accordingly, the above disclosure should be construed as limited only by the metes and bounds of the appended claims.

What is claimed is:

1. An image displaying method for a driving module of a display device, comprising:
   decoding an encoded mask, to generate a first mask of configuring a non-display area and a display area of a display module of the display device;
   accessing the first mask to generate a second mask, wherein the step of generating the second mask based on the first mask comprises one of the following options:
      reversing the first mask upside-down to generate the second mask; and
      reversing the first mask upside-down and laterally, to generate the second mask; and
   overlapping image data and the second mask, to generate driving signals of controlling the display module to display the overlapped image data;
   wherein the step of overlapping the image data and the second mask, to generate the driving signals of controlling the display module to display the overlapped image data comprises overlapping the image data and the second mask and adjusting image information of first display units to generate the overlapped image data, wherein the first display units are in the display area, at edges between the non-display area and the display area.

2. The image displaying method of claim 1, wherein the step of generating the second mask based on the first mask further comprises:

utilizing the first mask as the second mask.

3. The image displaying method of claim 1, wherein the step of generating the second mask based on the first mask comprises:

reversing the first mask laterally, to generate the second mask.

* * * * *